United States Patent
Kim et al.

(10) Patent No.: US 7,486,536 B2
(45) Date of Patent: Feb. 3, 2009

(54) PHASE-CHANGEABLE MEMORY DEVICE AND METHOD OF PROGRAMMING THE SAME

(75) Inventors: Hye-Jin Kim, Seoul (KR); Du-Eung Kim, Yongin-si (KR); Kwang-Jin Lee, Hwaseong-si (KR); Yu-Hwan Ro, Seoul (KR)

(73) Assignee: Samsung Electronics Co., Ltd. (KR)

( * ) Notice: Subject to any disclaimer, the term of this patent is extended or adjusted under 35 U.S.C. 154(b) by 14 days.

(21) Appl. No.: 11/301,322

(22) Filed: Dec. 12, 2005

(65) Prior Publication Data

US 2007/0008769 A1   Jan. 11, 2007

(30) Foreign Application Priority Data

Jul. 6, 2005   (KR) .................. 10-2005-0060848

(51) Int. Cl.
*G11C 11/00* (2006.01)
(52) U.S. Cl. .................. 365/148; 365/163; 365/100; 365/113
(58) Field of Classification Search .................. 365/148, 365/163, 100, 113, 185.19
See application file for complete search history.

(56) References Cited

U.S. PATENT DOCUMENTS

| | | | |
|---|---|---|---|
| 3,922,648 A | 11/1975 | Buckley | |
| 6,141,241 A | 10/2000 | Ovshinsky et al. | 365/163 |
| 6,343,033 B1 | 1/2002 | Parker | 365/185.19 |
| 6,570,784 B2 * | 5/2003 | Lowrey | 365/163 |
| 6,625,054 B2 | 9/2003 | Lowrey et al. | 365/148 |
| 6,707,712 B2 * | 3/2004 | Lowery | 368/175 |
| 6,914,801 B2 * | 7/2005 | Kostylev et al. | 365/148 |
| 7,136,299 B2 * | 11/2006 | Chu et al. | 365/163 |
| 7,327,602 B2 * | 2/2008 | Kostylev et al. | 365/163 |
| 2003/0218904 A1 | 11/2003 | Lowrey | |

FOREIGN PATENT DOCUMENTS

| | | |
|---|---|---|
| EP | 1450373 A1 | 8/2004 |
| JP | 2001-057091 | 2/2001 |
| KR | 10-2005-0007653 | 1/2005 |

\* cited by examiner

*Primary Examiner*—D. L.
(74) *Attorney, Agent, or Firm*—Mills & Onello LLP

(57) ABSTRACT

Disclosed is a phase-changeable memory device and method of programming the same. The phase-changeable memory device includes memory cells each having multiple states, and a program pulse generator providing current pulses to the memory cells. The program pulse generator initializes a memory cell to a reset or set state by applying a first pulse thereto and thereafter provides a second pulse to program the memory cell to one of the multiple states. According to the invention, as a memory cell is programmed after being initialized to a reset or set state, it is possible to correctly program the memory cell without influence from the previous state of the memory cell.

37 Claims, 6 Drawing Sheets

(a)

(b)

(b)

(b)

PHASE-CHANGEABLE MEMORY DEVICE AND METHOD OF PROGRAMMING THE SAME

CROSS-REFERENCE TO RELATED APPLICATIONS

This U.S. non-provisional patent application claims priority under 35 U.S.C. §119 of Korean Patent Application 2005-60848 filed on Jul. 6, 2005, the entire contents of which are hereby incorporated by reference.

BACKGROUND

The present invention is concerned with semiconductor memory devices, which in particular relates to a phase-changeable memory device and method of programming the same.

The demand for semiconductor memory devices operable with random access in high integration density and large capacity is increasing. Flash memories, which are typically used in portable electronic devices, are typically regarded as such semiconductor memory devices. New kinds of proposed semiconductor memory devices each include a capacitor that is made of a nonvolatile material instead of the volatile material of a DRAM. Such devices include ferroelectric RAMs (FRAM) employing ferroelectric capacitors, magnetic RAMs (MRAM) employing tunneling magneto-resistive (TMR) films, and phase-changeable memories (or PRAM) using chalcogenide alloys. The phase-changeable memory devices, as nonvolatile memory devices, are able to be fabricated more readily than other memories and are advantageous in implementing large-capacity memories at low cost.

FIG. 1 is an equivalent circuit diagram illustrating a memory cell of a phase-changeable memory device. As shown in FIG. 1, a memory cell 10 of the phase-changeable memory device is composed of a variable resistor C and an access transistor M.

The variable resistor C is connected to a bitline BL. The access transistor M is connected between the variable resistor C and a ground voltage. A wordline WL is coupled to a gate of the access transistor M. When a predetermined voltage is applied to the wordline WL, the access transistor M is turned on to supply the variable resistor C with a current Ic through the bitline BL.

The variable resistor C contains a phase-changeable material (not shown). The phase-changeable material is conditioned in one of two stable states, i.e., a crystalline state or an amorphous state. The phase-changeable material changes into the crystalline state or the amorphous state depending on the current Ic that is supplied through the bitline BL. The phase-changeable memory programs data therein by means of such a characteristic of the phase-changeable material.

FIG. 2 is a graphic diagram showing a characteristic of a phase-changeable material. In FIG. 2, a reference number 1 denotes the conditioning curve to be the amorphous state while a reference number 2 denotes the conditioning curve to be the crystalline state.

Referring to FIG. 2, the phase-changeable material (GST) turns to the amorphous state when it is rapidly quenched after being heated at high temperature over its melting point Tm during a time Ti by current supply. The amorphous state is usually referred to as a reset state, storing data '1'. Otherwise, the phase-changeable material is settled in the crystalline state when it is slowly quenched after being heated at a temperature higher than crystallization temperature Tc and lower than melting point Tm during a time T2 longer than T1.

The crystalline state is usually referred to as a set state, storing data '0'. The memory cell is conductive with resistance variable in accordance with the amorphous volume of the phase-changeable material. The resistance in the memory cell is highest in the amorphous state and lowest in the crystalline state.

SUMMARY OF THE INVENTION

The invention is directed to a method of correctly programming data in a phase-changeable memory having multi-level cells regardless of a previous state thereof.

The invention is also directed to a phase-changeable memory capable of programming data therein in correct regardless of a previous state thereof.

According to a first aspect, the invention is directed to a method of programming data in a phase-changeable memory device. According to the method, a first pulse is applied to a memory cell with multiple states. A second pulse is applied to condition the memory cell to one of the multiple states. The second pulse is variable in waveform depending on the multiple states.

In one embodiment, the first pulse conditions the memory cell to be in a reset state. The second pulse can be varied in falling time in accordance with the multiple states. In one embodiment, the falling time of the second pulse is longer as the memory cell transitions to a set state from the reset state. The second pulse can be varied in amplitude in accordance with the multiple states. The amplitude of the second pulse can be smaller as the memory cell transitions to a set state from the reset state. In one embodiment, the second pulse varies in duration in accordance with the multiple states. The duration of the second pulse can be larger as the memory, cell transitions to a set state from the reset state. In one embodiment, the second pulse varies in amplitude and duration in accordance with the multiple states. The second pulse can be smaller in amplitude and larger in duration as the memory cell transitions to a set state from the reset state.

In one embodiment, the first pulse conditions the memory cell to be in a set state. The second pulse can vary in falling time in accordance with the multiple states. The falling time of the second pulse can be shorter as the memory cell transitions to a reset state from the set state. In one embodiment, the second pulse varies in amplitude in accordance with the multiple states. The amplitude of the second pulse can be larger as the memory cell transitions to a reset state from the set state. In one embodiment, the second pulse varies in duration in accordance with the multiple states. The duration of the second pulse can be smaller as the memory cell transitions to a reset state from the set state. In one embodiment, the second pulse varies in amplitude and duration in accordance with the multiple states. The second pulse can be larger in amplitude and smaller in duration as the memory cell transitions to a reset state from the set state.

According to another aspect, the invention is directed to a method of programming data in a phase-changeable memory device. According to the method, a memory cell is initialized to a first state regardless of multiple-bit data to be programmed. The memory cell is programmed to a second state from the first state in correspondence with the multiple-bit data to be programmed.

In one embodiment, the initializing step includes applying a first pulse to the memory cell. In one embodiment, the programming step includes applying a second pulse to the memory cell initialized to the first state. The first pulse can remain constant while the second pulse varies in waveform in accordance with the multiple-bit data to be programmed. The first state can be a reset state or a set state.

According to another aspect, the invention is directed to a phase-changeable memory. The memory includes a memory cell with multiple states and a program pulse generator. The program pulse generator applies a first pulse to the memory cell and a second pulse to condition the memory cell to be in one of the multiple states. The second pulse is variable in waveform dependent on the multiple states.

In one embodiment, the first pulse conditions the memory cell to be in a reset state. The falling time of the second pulse can be longer as the memory cell transitions to a set state from the reset state. The amplitude of the second pulse can be smaller as the memory cell transitions to a set state from the reset state. The duration of the second pulse can be larger as the memory cell transitions to a set state from the reset state.

In one embodiment, the first pulse conditions the memory cell to be in a set state. The falling time of the second pulse can be shorter as the memory cell transitions to a reset state from the set state. The amplitude of the second pulse can be larger as the memory cell transitions to a reset state from the set state. The duration of the second pulse can be smaller as the memory cell transitions to a reset state from the set state.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF PREFERRED EMBODIMENTS

Recently, there have been proposed technologies for storing more than two bits in a single memory cell. Such a memory cell is called a multi-level cell (MLC). In the phase-changeable memory device, a multi-level cell is further operable in intermediate states between the reset and set states. A program method in the phase-changeable memory having multi-level cells is disclosed in U.S. Pat. No. 6,625,054 (hereinafter, the '054 patent).

Figure 3:
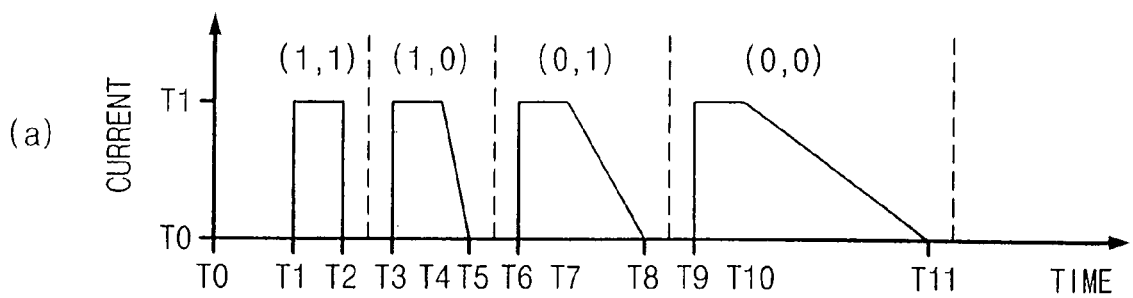
FIG. 3 is a graphic diagram showing a method of programming a phase-changeable memory device including multi-level cells.
Figure 3:
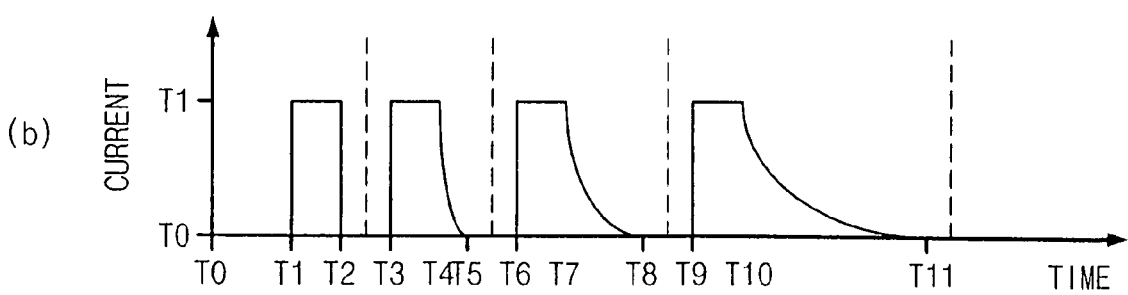
Figure 3:
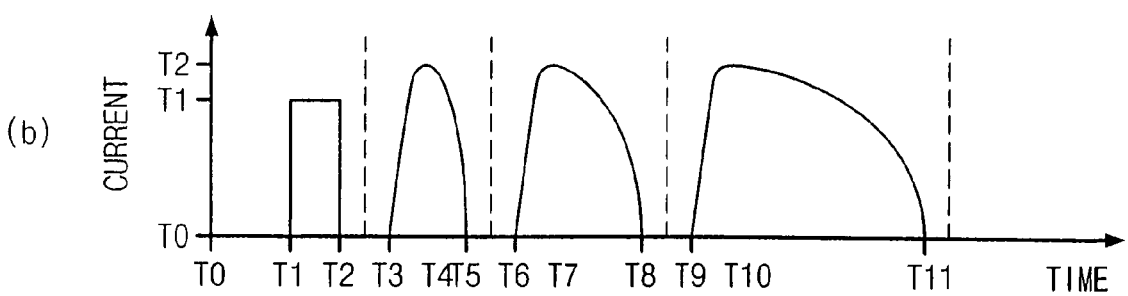
Figure 3:
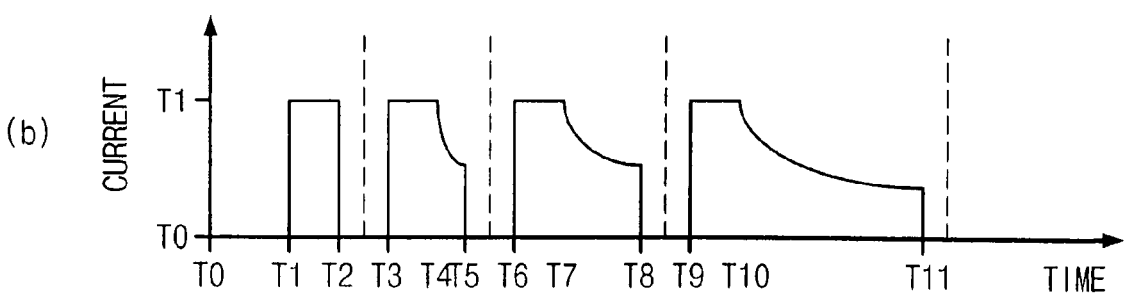

FIG. 3 is a graphic diagram showing a conventional method of programming a phase-changeable memory device including multi-level cells, which is shown in the '054 patent. Referring to FIG. 3, the memory cell is operable with four states along falling times of a current pulse. Provided that the reset state of the memory cell corresponds to data <1,1> and the set state of the memory cell corresponds to data <0,0>, the memory cell is further operable in data states of <1,0> and <0,1> in accordance with amorphous volume of the phase-changeable material.

According to the '054 patent, the phase-changeable memory device programs a single memory cell with two bits by controlling a falling time of a current pulse supplied into the memory cell. The '054 patent utilizes the characteristic that the amorphous volume of the phase-changeable material becomes smaller as a falling time of the current pulse is longer.

However, the '054 patent is involved in the problem that the amorphous volume of the phase-changeable material varies dependent on the previous state thereof when the current pulse is applied to a selected memory cell. For instance, comparing the case of programming a memory cell from <1,0> to <0,1> with the case of programming a memory cell from <0,0> to <0,1>, the amorphous volume of the phase-changeable material may be changed by the previous state even though the memory cell results all in the data state <0,1>. With the repetition of such transitions in data states, it is impossible to correctly differentiate the data states by the amorphous volume of the phase-changeable material. That is, the conventional phase-changeable memory device is insufficient to conduct an accurate program operation with reliability because it programs data without regard to the previous data state.

Figure 4:
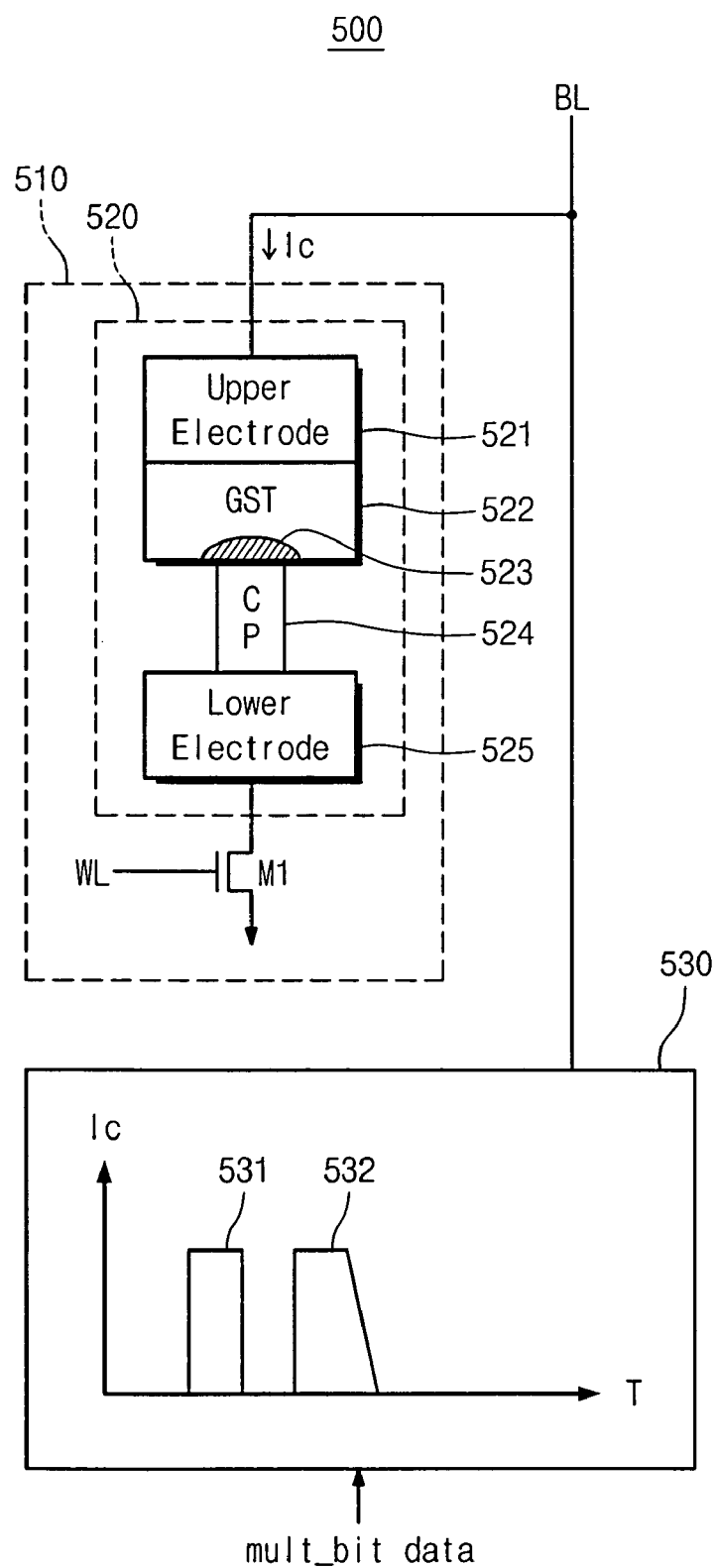
FIG. 4 is a circuit diagram illustrating a phase-changeable memory device according to an embodiment of the invention.

FIG. 4 is a circuit diagram illustrating a phase-changeable memory device according to an embodiment of the invention. Referring to FIG. 4, the phase-changeable memory device 500 is comprised of a memory cell 510 and a program pulse generator 530.

The memory cell 510 includes a variable resistor 520 and an access transistor M1. The access transistor M1 is connected between the variable resistor 520 and the ground voltage. The wordline WL is coupled to a gate of the access transistor M1. When the access transistor M1 is turned on, the variable resistor 520 is supplied with the current Ic by way of the bitline BL. In FIG. 4, the access transistor M1 may be implemented in the form of diode.

Referring to FIG. 4, the variable resistor 520 is composed of an upper electrode 521, a phase-changeable material 522, a contact plug (CP) 524, and the lower electrode 525. The upper electrode 521 is connected to the bitline BL. The lower electrode 525 is connected between the contact plug 524 and the access transistor M1. The contact plug 524, also referred to as a "heater plug," is formed of a conductive material (e.g., titanium nitride; TiN). The phase-changeable material 522 is interposed between the upper electrode 521 and the contact plug 524.

The state of the phase-changeable material 522 is variable in accordance with amplitude, duration, and a falling time of the current pulse. The hatched portion 523 denotes the amorphous portion of the phase-changeable material. As it progresses to the crystalline state from the amorphous state, the amorphous volume becomes smaller in quantity.

The memory cell 510 may be conditioned in more two states in accordance with the current pulse supplied from the program pulse generator 530, which is called "multi-state". The memory cell 510 is set to one of the multi-states by the amorphous volume 523 of the phase-changeable material 522. The resistance of the variable resistor 520 is dependent on the amorphous volume 523 of the phase-changeable material 522.

The program pulse generator 530 receives multi-bit data and then provides two current pulses. The program pulse generator 530 is able to provide more than two current pulses.

The first pulse 531 is provided to initialize the phase-changeable material 522 in the reset or set state. The first pulse 531 maintains the same waveform regardless of input data; while the second pulse 532 is variable in waveform by input data. The second pulse 532 is provided to program the memory cell 510 to one of the multi-states. The second pulse 532 is adjustable with regard to falling time, amplitude, and/or duration, which are variable according to the multi-states. It is also possible for the program pulse generator 530 to provide various current pulses as shown in the '053 patent and in FIGS. 6 and 7 herein.

Figure 5:
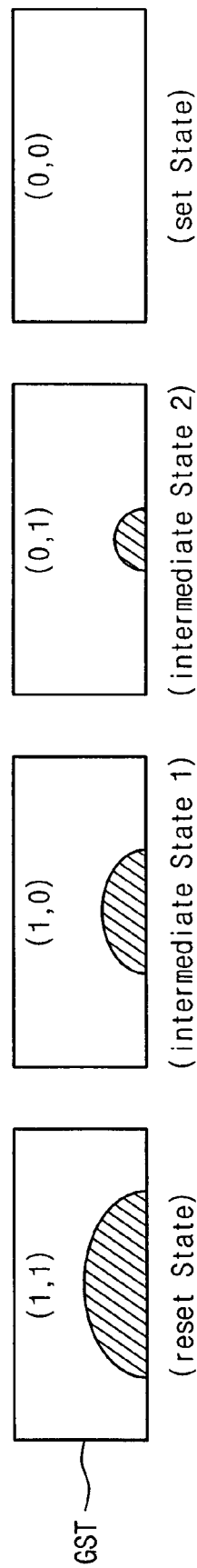
FIG. 5 is a diagram illustrating multiple states of a phase-changeable material (GST) shown in FIG. 4.

FIG. 5 is a diagram illustrating the multiple states of the phase-changeable material (GST) shown in FIG. 4. Referring to FIG. 5, a single memory cell is conditioned in one of the four states in accordance with the phase-changeable material (GST), storing 2-bit data.

The phase-changeable material (GST) storing data <1,1> is laid on the amorphous state, the reset state, or the <1,1> state. The <1,1> state has the largest amorphous volume and the highest resistance. On the other hand, the phase-changeable material (GST) storing data <0,0> is laid on the crystalline state, the set state, or the <0,0> state. The <0,0> state has the lowest amorphous volume, almost zero, and the lowest resistance.

The phase-changeable material (GST) storing data <1,0> is conditioned in the first intermediate state between the amorphous state and the crystalline state. The <1,0> state has amorphous volume and resistance smaller than those of the <1,1> state. The phase-changeable material (GST) storing data <0,1> is conditioned in the second intermediate state between the amorphous state and the crystalline state. The <0,1> state has amorphous volume and resistance smaller than those of the <1,0> state.

Figure 6:
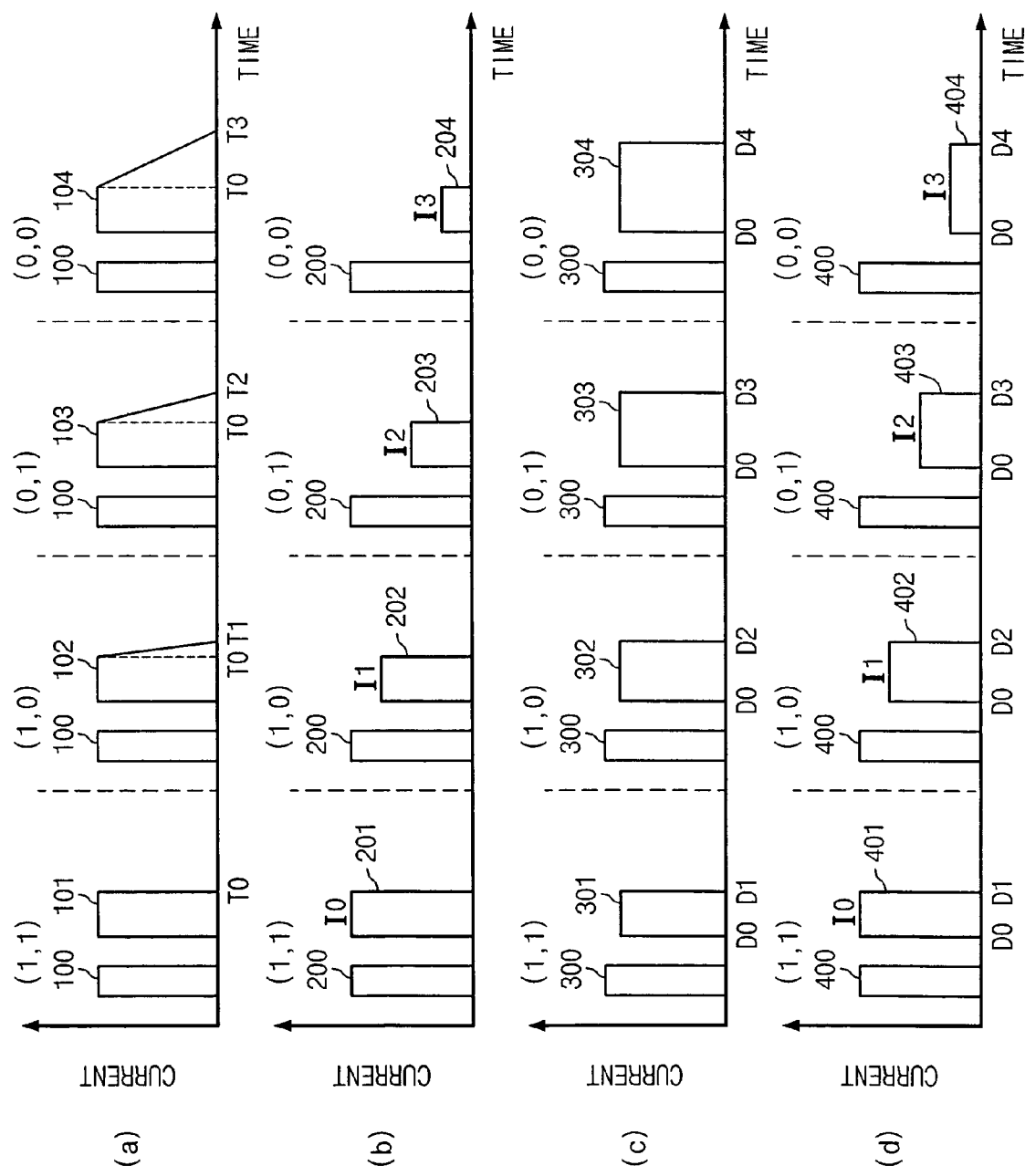
FIGS. 6 and 7 are graphic waveform diagrams illustrating methods of programming a phase-changeable memory device in accordance with the invention.
Figure 7:
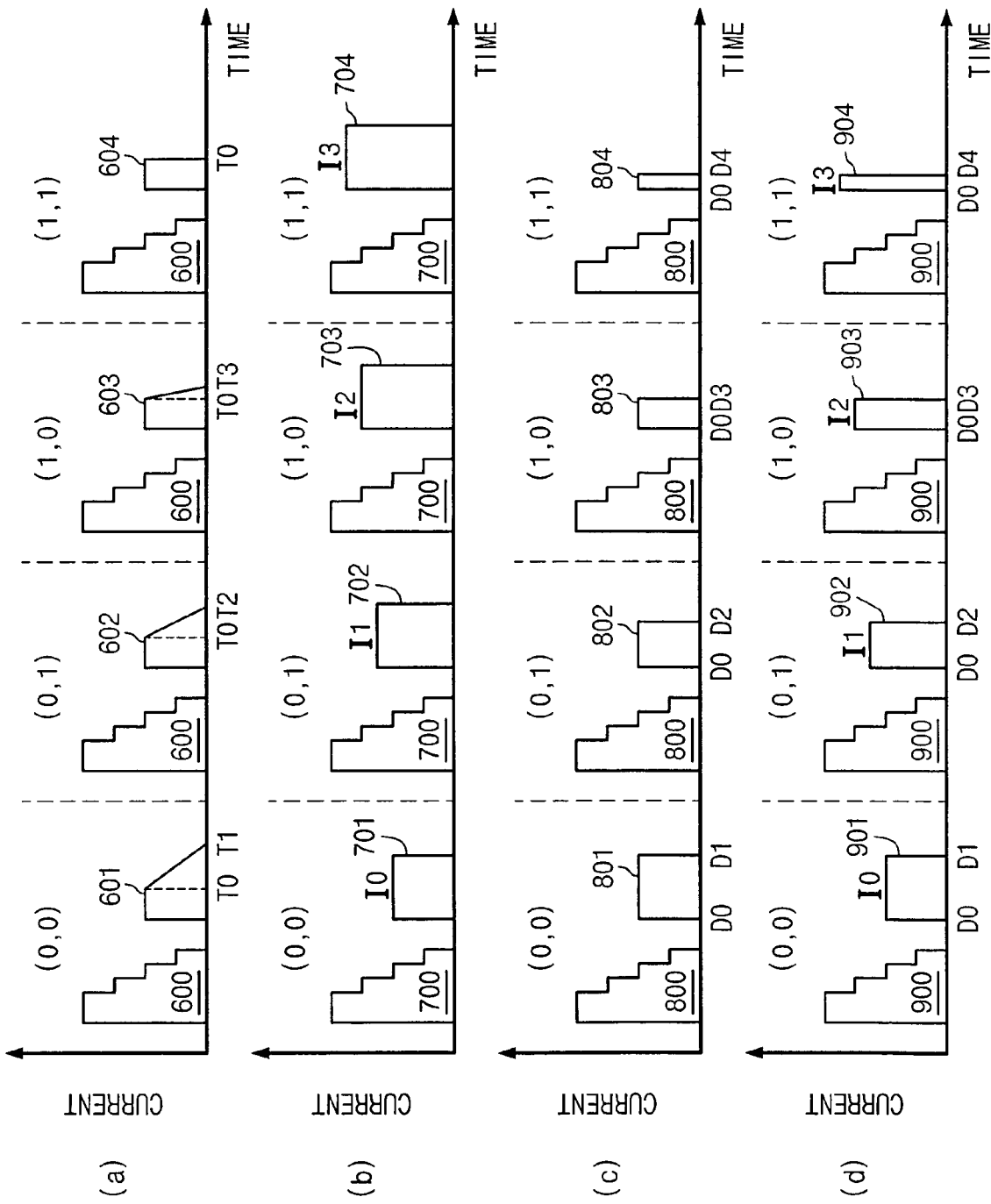

FIGS. 6 and 7 are graphic waveform diagrams illustrating methods of programming a phase-changeable memory device in accordance with the invention. Waveforms (a) through (d) of FIG. 6 are associated with the case of initializing the memory cell in the reset state while waveforms (a) through (d) of FIG. 7 are associated with the case of initializing the memory cell in the set state.

Waveforms (a) through (d) of FIG. 6 illustrate the first and second pulses in programming data after initializing the memory cell in the reset state, in which the first pulse maintains its waveform constant while the second pulse is variable in waveform dependent on the multi-states. Waveform (a) illustrates the case when the second pulse varies with falling time, and waveform (b) illustrates the case when the second pulse varies with amplitude. Waveform (c) illustrates the case when the second pulse varies with duration, and waveform (d) illustrates the case when the second pulse varies with amplitude and duration.

Figure 1:
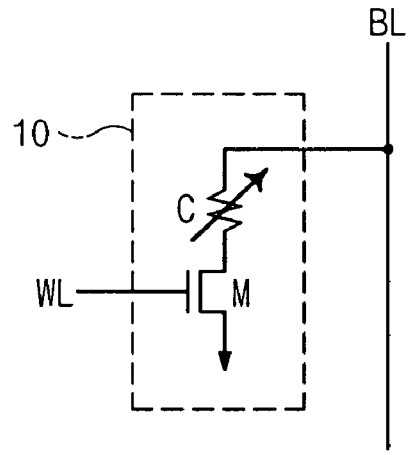
FIG. 1 is an equivalent circuit diagram illustrating a memory cell of a phase-changeable memory device.
Figure 2:
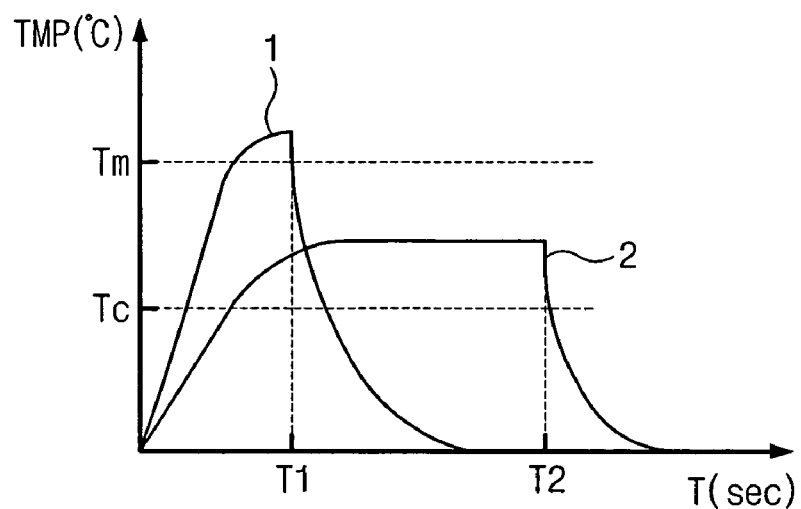
FIG. 2 is a graphic diagram showing a characteristic of a phase-changeable material.

Referring to waveform (a) of FIG. 6, the first pulse 100 remains constant regardless of the multi-states, while the second pulses, 101, 102, 103, and 104, are different from each other in falling time in accordance with the multi-states. Here, the falling time is defined as a time taken for the current Ic to fall down to the minimum level from the maximum level. As illustrated in FIG. 2, the phase-changeable material (GST) is variable in the amorphous volume by a quenching time. Thus, the memory cell can be programmed to a desired state by controlling the falling time of the second pulse.

The first pulse 100 initializes the memory cell in the reset state regardless of the previous state. The second pulses 101-104 are different in their falling times in accordance with the multi-states, being used to program the memory cell in a desired state. The second pulse 101 has a falling time near zero. If the second pulse 101 is applied to the memory cell, the memory cell is programmed into the <1,1> state. The second pulse 102 has a falling time of T1-T0. If the second pulse 102 is applied to the memory cell, the memory cell is programmed into the <1,0> state. The second pulse 103 has a falling time of T2-T0. Here, the falling time of T2-T0 is longer than the falling time of T1-T0. If the second pulse 103 is applied to the memory cell, the memory cell is programmed into the <0,1> state. The second pulse 104 has a falling time of T3-T0. Here, the falling time of T3-T0 is longer than the falling time of T2-T0. If the second pulse 104 is applied to the memory cell, the memory cell is programmed into the <0,0> state. The second pulses with variable falling times may have more practical features as illustrated in FIG. 3.

Referring to waveform (b) of FIG. 6, the first pulse 200 remains constant regardless of the multi-states, while the second pulses, 201, 202, 203, and 204, are different from each other in pulse amplitude in accordance with the multi-states. Here, the pulse amplitude is defined as the maximum level of the current Ic. As illustrated in FIG. 2, the phase-changeable material (GST) is variable in the amorphous volume by temperature. Thus, the memory cell can be programmed in a desired state by controlling the amplitude of the second pulse.

The first pulse 200 initializes the memory cell in the reset state regardless of the previous state. The second pulses 201~204 are different in their amplitudes in accordance with the multi-states, being used to program the memory cell in a desired state. For instance, the second pulse 201 has amplitude of I0. If the second pulse 201 is applied to the memory cell, the memory cell is programmed into the <1,1> state. The second pulse 202 has amplitude of I1. Here, I1 is smaller than I0. If the second pulse 202 is applied to the memory cell, the memory cell is programmed into the <1,0> state. The second pulse 203 has amplitude of I2. Here, I2 is smaller than I1. If the second pulse 203 is applied to the memory cell, the memory cell is programmed into the <0,1> state. The second pulse 204 has amplitude of I3. Here, I3 is smaller than I2. If the second pulse 204 is applied to the memory cell, the memory cell is programmed into the <0,0> state.

Referring to waveform (c) of FIG. 6, the first pulse 300 remains constant regardless of the multi-states, while the second pulses, 301, 302, 303, and 304, are different from each other in duration (or pulse width) in accordance with the multi-states. Here, the duration is defined as a time of maintaining the maximum level of the current Ic. As illustrated in FIG. 2, the phase-changeable material (GST) is variable in the amorphous volume by the duration of temperature. Thus, the memory cell can be programmed in a desired state by controlling the duration of the second pulse.

The first pulse 300 initializes the memory cell in the reset state regardless of the previous state. The second pulses 301~304 are different in their durations (or pulse widths) in accordance with the multi-states, being used to program the memory cell in a desired state. The second pulse 301 has a duration of D1-D0. If the second pulse 301 is applied to the memory cell, the memory cell is programmed into the <1,1> state. The second pulse 302 has a duration of D2-D0. Here, D2-D0 is longer than D1-D0. If the second pulse 302 is applied to the memory cell, the memory cell is programmed into the <1,0> state. The second pulse 303 has a duration of D3-D0. Here, D3-D0 is longer than D2-D0. If the second pulse 303 is applied to the memory cell, the memory cell is programmed into the <0,1> state. The second pulse 304 has a duration of D4-D0. Here, D4-D0 is longer than D3-D0. If the second pulse 304 is applied to the memory cell, the memory cell is programmed into the <0,0> state.

Referring to waveform (d) of FIG. 6, the first pulse 400 remains constant regardless of the multi-states, while the second pulses, 401, 402, 403, and 404, are different from each other in duration and amplitude in accordance with the multi-states. As illustrated in FIG. 2, the phase-changeable material (GST) is variable in the amorphous volume by the maximum temperature and the duration time of temperature. Thus, the memory cell can be programmed in a desired state by controlling the duration and amplitude of the second pulse.

The first pulse 400 initializes the memory cell in the reset state regardless of the previous state. The second pulses 401~404 are different in their durations and amplitudes in accordance with the multi-states, being used to program the memory cell in a desired state. The second pulse 401 has amplitude of I0 and a duration of D1-D0. If the second pulse 401 is applied to the memory cell, the memory cell is programmed into the <1,1> state. The second pulse 402 has amplitude of I1 and a duration of D2-D0. Here, I1 is smaller than I0 and D2-D0 is longer than D1-D0. If the second pulse 402 is applied to the memory cell, the memory cell is programmed into the <1,0> state. The second pulse 403 has amplitude of I2 and a duration of D3-D0. Here, I2 is smaller than I1 and D3-D0 is longer than D2-D0. If the second pulse 403 is applied to the memory cell, the memory cell is programmed into the <0,1> state. The second pulse 404 has amplitude of I3 and a duration of D4-D0. Here, I3 is smaller than I2 and D4-D0 is longer than D3-D0. If the second pulse 404 is applied to the memory cell, the memory cell is programmed into the <0,0>0 state.

In FIG. 6, when the memory cell is required to be programmed into the <1,1> state, the first pulses, 100, 200, 300, and 400, may be used alone, that is, the second pulses, 101, 201, 301, and 401, may not be used.

With the program approaches shown in FIG. 6, the memory cell is programmed always from the reset state, so that it is possible to complete an accurate program operation without the program being affected by the previous state.

Waveforms (a) through (d) of FIG. 7 show the first and second pulses in programming data after initializing the memory cell in the set state, in which the first pulse maintains its waveform constant while the second pulse is variable in waveform dependent on the multi-states. Waveform (a) illustrates the case when the second pulse varies with falling time, and waveform (b) illustrates the case when the second pulse varies with amplitude. Waveform (c) illustrates the case when the second pulse varies with duration, and waveform (d) illustrates the case when the second pulse varies with amplitude and duration.

Referring to waveform (a) of FIG. 7, the first pulse 600 remains constant regardless of the multi-states, while the second pulses, 601, 602, 603, and 604, are different from each other in falling time in accordance with the multi-states.

The first pulse 600 initializes the memory cell in the set state regardless of the previous state. The second pulses 601~604 are different in their falling times in accordance with the multi-states, being used to program the memory cell in a desired state. The second pulse 601 has a falling time of T1-T0. If the second pulse 601 is applied to the memory cell, the memory cell is programmed into the <0,0> state. The second pulse 602 has a falling time of T2-T0. Here, T2-T0 is shorter than T1-T0. If the second pulse 602 is applied to the memory cell, the memory cell is programmed into the <0,1> state. The second pulse 603 has a falling time of T3-T0. Here, the T3-T0 is shorter than the falling time of T2-T0. If the second pulse 603 is applied to the memory cell, the memory cell is programmed into the <1,0> state. The second pulse 604 has a falling time near zero. If the second pulse 604 is applied to the memory cell, the memory cell is programmed into the <1,1> state.

Referring to waveform (b) of FIG. 7, the first pulse 700 remains constant regardless of the multi-states, while the second pulses, 701, 702, 703, and 704, are different from each other in pulse amplitude in accordance with the multi-states.

The first pulse 700 initializes the memory cell in the set state regardless of the previous state. The second pulses 701~704 are different in their amplitudes in accordance with the multi-states, being used to program the memory cell in a desired state. For instance, the second pulse 701 has amplitude of I0. If the second pulse 701 is applied to the memory cell, the memory cell is programmed into the <0,0> state. The second pulse 702 has amplitude of I1. Here, the I1 is larger than I0. If the second pulse 702 is applied to the memory cell, the memory cell is programmed into the <0,1> state. The second pulse 703 has amplitude of I2. Here, I2 is larger than I1. If the second pulse 703 is applied to the memory cell, the memory cell is programmed into the <1,0> state. The second pulse 704 has amplitude of I3. Here, I3 is larger than I2. If the second pulse 704 is applied to the memory cell, the memory cell is programmed into the <1,1> state.

Referring to waveform (c) of FIG. 7, the first pulse 800 remains constant regardless of the multi-states, while the second pulses, 801, 802, 803, and 804, are different from each other in duration (or pulse width) in accordance with the multi-states.

The first pulse 800 initializes the memory cell in the set state regardless of the previous state. The second pulses 801-804 are different in their durations (or pulse widths) in accordance with the multi-states, being used to program the memory cell in a desired state. The second pulse 801 has a duration of D1-D0. If the second pulse 801 is applied to the memory cell, the memory cell is programmed into the <0,0> state. The second pulse 802 has a duration of D2-D0. Here, D2-D0 is shorter than D1-D0. If the second pulse 802 is applied to the memory cell, the memory cell is programmed into the <0,1> state. The second pulse 803 has a duration of D3-D0. Here, D3-D0 is shorter than D2-D0. If the second pulse 803 is applied to the memory cell, the memory cell is programmed into the <1,0> state. The second pulse 804 has a duration of D4-D0. Here, D4-D0 is shorter than D3-D0. If the second pulse 804 is applied to the memory cell, the memory cell is programmed into the <1,1> state.

Referring to waveform (d) of FIG. 7, the first pulse 900 remains constant regardless of the multi-states, while the second pulses, 901, 902, 903, and 904, are different from each other in duration and amplitude in accordance with the multi-states.

The first pulse 900 initializes the memory cell in the set state regardless of the previous state. The second pulses 901-904 are different in their durations and amplitudes in accordance with the multi-states, being used to program the memory cell in a desired state. The second pulse 901 has amplitude of I0 and a duration of D1-D0. If the second pulse 901 is applied to the memory cell, the memory cell is programmed into the <0,0> state. The second pulse 902 has amplitude of I1 and a duration of D2-D0. Here, I1 is larger than I0 and D2-D0 is shorter than D1-D0. If the second pulse 902 is applied to the memory cell, the memory cell is programmed into the <0,1> state. The second pulse 903 has amplitude of I2 and a duration of D3-D0. Here, I2 is larger than I1 and D3-D0 is shorter than D2-D0. If the second pulse 903 is applied to the memory cell, the memory cell is programmed into the <1,0> state. The second pulse 904 has amplitude of I3 and a duration of D4-D0. Here, I3 is larger than I2 and D4-D0 is shorter than D3-D0. If the second pulse 904 is applied to the memory cell, the memory cell is programmed into the <1,1> state.

In FIG. 7, when the memory cell is required to be programmed into the <0,0> state, the first pulses, 600, 700, 800, and 900, may be used alone, that is, the second pulses, 601, 701, 801, and 901, may not be used.

With the program approaches shown in FIG. 7, the memory cell is programmed always from the reset state, so that it is possible to complete an accurate program operation without the operation being affected by the previous state. According to the invention, as the memory cell is programmed after being initialized in the reset or set state, it is possible to correctly program the memory cell without influence from the previous state.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of programming data in a phase-changeable memory device, comprising:
   applying a first pulse to a memory cell with multiple states; and
   applying a second pulse to condition the memory cell to one of the multiple states,
   wherein the second pulse is variable in waveform depending on the multiple states and the first pulse maintains the same waveform regardless of the multiple states, and
   wherein if the memory cell is programmed into one of a reset state and a set state, the first pulse can be applied to the memory cell to program the memory cell into the one of the reset state and the set state without applying the second pulse.

2. The method as set forth in claim 1, wherein the first pulse conditions the memory cell to be in a reset state.

3. The method as set forth in claim 2, wherein the second pulse varies in falling time in accordance with the multiple states.

4. The method as set forth in claim 3, wherein the falling time of the second pulse is longer as the memory cell transitions to a set state from the reset state.

5. The method as set forth in claim 2, wherein the second pulse varies in amplitude in accordance with the multiple states.

6. The method as set forth in claim 5, wherein the amplitude of the second pulse is smaller as the memory cell transitions to a set state from the reset state.

7. The method as set forth in claim 2, wherein the second pulse varies in duration in accordance with the multiple states.

8. The method as set forth in claim 7, wherein the duration of the second pulse is larger as the memory cell transitions to a set state from the reset state.

9. The method as set forth in claim 2, wherein the second pulse varies in amplitude and duration in accordance with the multiple states.

10. The method as set forth in claim 9, wherein the second pulse is smaller in amplitude and larger in duration as the memory cell transitions to a set state from the reset state.

11. The method as set forth in claim 1, wherein the first pulse conditions the memory cell to be in a set state.

12. The method as set forth in claim 11, wherein the second pulse varies in falling time in accordance with the multiple states.

13. The method as set forth in claim 12, wherein the falling time of the second pulse is shorter as the memory cell transitions to a reset state from the set state.

14. The method as set forth in claim 11, wherein the second pulse varies in amplitude in accordance with the multiple states.

15. The method as set forth in claim 14, wherein the amplitude of the second pulse is larger as the memory cell transitions to a reset state from the set state.

16. The method as set forth in claim 11, wherein the second pulse varies in duration in accordance with the multiple states.

17. The method as set forth in claim 16, wherein the duration of the second pulse is smaller as the memory cell transitions to a reset state from the set state.

18. The method as set forth in claim 11, wherein the second pulse varies in amplitude and duration in accordance with the multiple states.

19. The method as set forth in claim 18, wherein the second pulse is larger in amplitude and smaller in duration as the memory cell transitions to a reset state from the set state.

20. A method of programming data in a phase-changeable memory device, comprising:
   initializing a memory cell to a first state regardless of multiple-bit data to be programmed, the initializing comprising applying a first pulse to the memory cell; and
   programming the memory cell to a second state from the first state in correspondence with the multiple-bit data to be programmed, the programming comprising applying a second pulse to the memory cell initialized to the first state,
   wherein the first pulse remains constant while the second pulse varies in waveform in accordance with the multiple-bit data to be programmed, and
   wherein if the memory cell is programmed into one of a reset state and a set state, the first pulse can be applied to the memory cell to program the memory cell into the one of the reset state and the set state without applying the second pulse.

21. The method as set for the in claim 20, wherein the first state is one of a reset state and a set state.

22. A phase-changeable memory comprising:
   a memory cell with multiple states; and
   a program pulse generator applying a first pulse to the memory cell and applying a second pulse to condition the memory cell to be in one of the multiple states,
   wherein the second pulse is variable in waveform dependent on the multiple states and the first pulse maintains the same waveform regardless of the multiple states, and
   wherein if the memory cell is programmed into one of a reset state and a set state, the first pulse can be applied to the memory cell to program the memory cell into the one of the reset state and the set state without applying the second pulse.

23. The phase-changeable memory as set forth in claim 22, wherein the first pulse conditions the memory cell to be in a reset state.

24. The phase-changeable memory as set forth in claim 23, wherein the falling time of the second pulse is longer as the memory cell transitions to a set state from the reset state.

25. The phase-changeable memory as set forth in claim 23, wherein the amplitude of the second pulse is smaller as the memory cell transitions to a set state from the reset state.

26. The phase-changeable memory as set forth in claim 23, wherein the duration of the second pulse is larger as the memory cell transitions to a set state from the reset state.

27. The phase-changeable memory as set forth in claim 22, wherein the first pulse conditions the memory cell to be in a set state.

28. The phase-changeable memory as set forth in claim 27, wherein the falling time of the second pulse is shorter as the memory cell transitions to a reset state from the set state.

29. The phase-changeable memory as set forth in claim 27, wherein the amplitude of the second pulse is larger as the memory cell transitions to a reset state from the set state.

30. The phase-changeable memory as set forth in claim 27, wherein the duration of the second pulse is smaller as the memory cell transitions to a reset state from the set state.

31. A method of programming data in a phase-changeable memory device, comprising:
   applying a first pulse to a memory cell with multiple states; and
   applying a second pulse to condition the memory cell to one of the multiple states,
   wherein the second pulse is variable in waveform depending on the multiple states, and
   wherein the first pulse conditions the memory cell to be in a set state and the second pulse varies in falling time in accordance with the multiple states and the falling time of the second pulse is shorter as the memory cell transitions to a reset state from the set state.

32. A method of programming data in a phase-changeable memory device, comprising:
   applying a first pulse to a memory cell with multiple states; and
   applying a second pulse to condition the memory cell to one of the multiple states,
   wherein the second pulse is variable in waveform depending on the multiple states, and
   wherein the first pulse conditions the memory cell to be in a set state and the second pulse varies in amplitude in accordance with the multiple states and the amplitude of the second pulse is larger as the memory cell transitions to a reset state from the set state.

33. A method of programming data in a phase-changeable memory device, comprising:
   applying a first pulse to a memory cell with multiple states; and
   applying a second pulse to condition the memory cell to one of the multiple states,
   wherein the second pulse is variable in waveform depending on the multiple states, and
   wherein the first pulse conditions the memory cell to be in a set state and the second pulse varies in duration in accordance with the multiple states and the duration of the second pulse is smaller as the memory cell transitions to a reset state from the set state.

34. A method of programming data in a phase-changeable memory device, comprising:
   applying a first pulse to a memory cell with multiple states; and
   applying a second pulse to condition the memory cell to one of the multiple states,
   wherein the second pulse is variable in waveform depending on the multiple states, and
   wherein the first pulse conditions the memory cell to be in a set state and the second pulse varies in amplitude and duration in accordance with the multiple states and the second pulse is larger in amplitude and smaller in duration as the memory cell transitions to a reset state from the set state.

35. A phase-changeable memory comprising:
   a memory cell with multiple states; and
   a program pulse generator applying a first pulse to the memory cell and applying a second pulse to condition the memory cell to be in one of the multiple states,
   wherein the second pulse is variable in waveform dependent on the multiple states, and
   wherein the first pulse conditions the memory cell to be in a set state and the falling time of the second pulse is shorter as the memory cell transitions to a reset state from the set state.

36. A phase-changeable memory comprising:
   a memory cell with multiple states; and
   a program pulse generator applying a first pulse to the memory cell and applying a second pulse to condition the memory cell to be in one of the multiple states,
   wherein the second pulse is variable in waveform dependent on the multiple states, and
   wherein the first pulse conditions the memory cell to be in a set state and the amplitude of the second pulse is larger as the memory cell transitions to a reset state from the set state.

37. A phase-changeable memory comprising:
   a memory cell with multiple states; and
   a program pulse generator applying a first pulse to the memory cell and applying a second pulse to condition the memory cell to be in one of the multiple states,
   wherein the second pulse is variable in waveform dependent on the multiple states, and
   wherein the first pulse conditions the memory cell to be in a set state and the duration of the second pulse is smaller as the memory cell transitions to a reset state from the set state.

* * * * *